(12) United States Patent
Foster

(10) Patent No.: US 6,791,166 B1
(45) Date of Patent: Sep. 14, 2004

(54) STACKABLE LEAD FRAME PACKAGE USING EXPOSED INTERNAL LEAD TRACES

(75) Inventor: Donald Craig Foster, Mesa, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/829,341

(22) Filed: Apr. 9, 2001

(51) Int. Cl.⁷ .............................................. H01L 23/495
(52) U.S. Cl. ........................ 257/666; 257/676; 361/813
(58) Field of Search ................................. 361/772–774, 361/813, 790–792, 760–761; 257/666–668, 676–677, 728–729, 672, 777, 678; 438/123, 106, 107

(56) References Cited

U.S. PATENT DOCUMENTS

| 5,012,323 A | 4/1991 | Farnworth .................... 357/75 |
| 5,245,215 A | 9/1993 | Sawaya ....................... 257/676 |
| 5,291,061 A | 3/1994 | Ball ........................... 257/686 |
| 5,332,864 A | 7/1994 | Liang et al. ................ 174/52.4 |
| 5,347,429 A | 9/1994 | Kohno et al. ................ 361/813 |
| 5,455,387 A | 10/1995 | Hoffman et al. ............ 174/52.4 |
| 5,457,341 A * | 10/1995 | West .......................... 257/666 |
| 5,462,624 A | 10/1995 | Kwon ........................ 156/257 |
| 5,780,925 A | 7/1998 | Cipolla et al. .............. 257/676 |
| 5,793,108 A | 8/1998 | Nakanishi et al. .......... 257/723 |
| 5,898,220 A | 4/1999 | Ball ........................... 257/723 |
| 5,977,615 A * | 11/1999 | Yamaguchi et al. ........ 257/666 |
| RE36,613 E | 3/2000 | Ball ........................... 257/777 |
| 6,034,422 A * | 3/2000 | Horita et al. ................ 257/666 |
| 6,157,074 A * | 12/2000 | Lee ............................ 257/666 |
| 6,225,146 B1 | 5/2001 | Yamaguchi et al. ........ 438/123 |

* cited by examiner

Primary Examiner—Carl Whitehead, Jr.
Assistant Examiner—Tuan Dinh
(74) Attorney, Agent, or Firm—Bever, Hoffman & Harms, LLP; James E. Parsons

(57) ABSTRACT

A die package is formed, which allows additional electrical connections to the die by using internal leads or traces from a lead frame. The internal leads are exposed through an upper or lower surface of the package, thereby allowing an additional die package to be stacked and electrically connected to the underlying die or additional inputs/outputs to underlying external circuitry, such as a printed circuit board.

23 Claims, 6 Drawing Sheets

STACKABLE LEAD FRAME PACKAGE USING EXPOSED INTERNAL LEAD TRACES

CROSS-REFERENCE TO RELATED APPLICATIONS

This application is related to commonly-owned U.S. patent application Ser. No. 09/659,017, filed Sep. 8, 2000.

BACKGROUND

1. Field of Invention

The present invention relates to integrated circuit packaging.

2. Related Art

Semiconductor die or chip packages are used to protect the semiconductor device (e.g., an integrated circuit chip) and allow the chip to be electrically connected to external circuitry. The chip typically has a surface containing active circuit elements that can be accessed via conductors on the chip, such as bonding pads. The chip can be packaged using numerous packaging techniques, as is known in the art. The package can then be placed into a printed circuit board (PCB) to access the circuitry on the IC chip and perform desired operations. External leads, such as bond fingers, exposed through the package allow electrical input/output connections between the enclosed chip and the PCB.

As the complexity of operations and applications increases, a greater number of inputs to and outputs from the chip may be needed to implement the necessary functions. However, this typically requires increasing the size of the package. The increased complexity also results in a greater number of chips needed on the PCB to implement the necessary functions Further, with the increased complexity comes a need for a greater number of chips on the PCB to implement the necessary functions. Conventional methods to increase the number of chips without increasing the package size is to stack multiple chips on the package, in which typically two or more stacked die are each electrically connected to leads on the package or lead frame. However, a faulty die on the package can consume one or more good die, thereby reducing yield.

Thus, it is desirable to have a die package without the disadvantages discussed above associated with conventional packages.

SUMMARY

In the present invention, a method and structure utilize exposed internal leads to provide additional input/output connections or additional die to be stacked and connected.

According to the one embodiment of the present invention, electrically isolated signal traces within the paddle area are created for die signal connection and held together using lead lock tape. These signal traces or internal leads are completely internal to the package and not connected to the external leads. The internal leads are down set or bent during the lead frame manufacturing process before the die assembly process. After a die is attached to the package, bond wires are connected from the die to both the external and internal leads. The die and bond wires are then encapsulated, with the ends of the internal leads exposed. The die contained in the resulting package can then be connected to external circuitry, such as a printed circuit board, through both the external and internal leads. In addition to the external and internal leads, an exposed die pad to the internal leads can also be used to connect the die to the printed circuit board. Consequently, an increased number of inputs to and outputs from the die is available.

In another embodiment, the internal leads are down set or bent away from the ends of the external leads. After wire bonding and die encapsulation, the ends of the internal leads are exposed on an upper portion of the die package. A second die package can then be stacked onto this first die package, with external leads from the second die package electrically coupled to the internal leads from the first die package. This allows electrical connection between the two dies in a smaller profile package.

In one set of embodiments, the internal leads and external leads are not interleaved, i.e., the ends of the leads to not overlap. This allows a smaller exposed area of the internal leads. In another set of embodiments, the internal leads and external leads are interleaved, i.e., the ends of the internal leads extend beyond the ends of the external leads. These embodiments allow shorter bond wires to be used for connecting the die to the external leads.

The present invention will be more fully understood when taken in light of the following detailed description taken together with the accompanying drawings.

BRIEF DESCRIPTION OF THE DRAWINGS

Use of the same or similar reference numbers in different figures indicates same or like elements.

DETAILED DESCRIPTION OF THE PREFERRED EMBODIMENTS

The present invention provides a method and structure in which additional leads are exposed through a chip package, thereby increasing the number of input/output connections to the external printed circuit board (PCB) and allowing at least an additional chip package to be stacked using these additional leads. The additional leads are formed from inner lead traces (ILTs), which are formed by etching or stamping signal trace defining slots, then trimming the edge of the ILT paddle area to create electrically isolated traces. The traces are then bent toward the surface of the package to provide the additional external leads.

Figure 1:
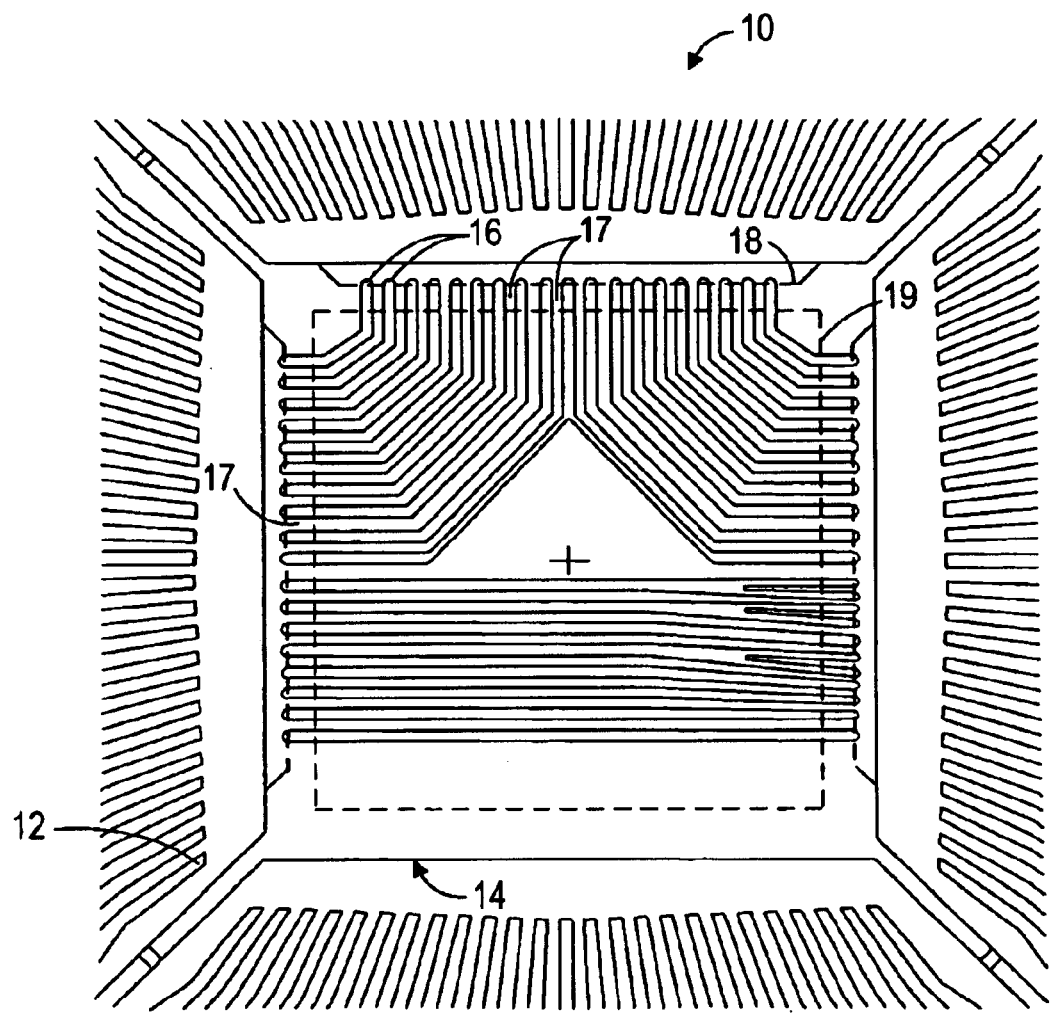
FIG. 1 is a top view of a lead frame for use in forming internal leads.

FIG. 1 is a top view of an ILT lead frame 10 having a plurality of first external lead fingers or outer lead traces (OLTs) 12 and an internal paddle area 14 containing slots 16 and traces 17, where traces 17 are electrically connected. Lead frame 10 is shown having slots 16 ending at three sides of the package. However, the lead frame can be any suitable type, such as for a dual-sided or quad package.

The outer portions of paddle area 14 are removed or trimmed to create inner lead traces (ILTs) that will form a second set of external leads. In FIG. 1, dotted line 18 shows, for example, portions of paddle area 14 to be removed, such by trimming or cutting. Prior to removing the outer portions, a tape, such as a standard lead locking tape, is placed over an interior portion on either side of paddle area 14, such as shown by dotted line 19. The tape may also serve as a permanent plating mask for plating the tips of the ILTs. The size of the tape must be such that enough of the resulting inner lead traces is exposed to be able to reach the upper or lower surface of the package when the lead traces are bent upward or downward, respectively. The length of the exposed lead traces depends on the distance between the paddle area and the desired surface (upper or lower) of the package.

Figure 2:
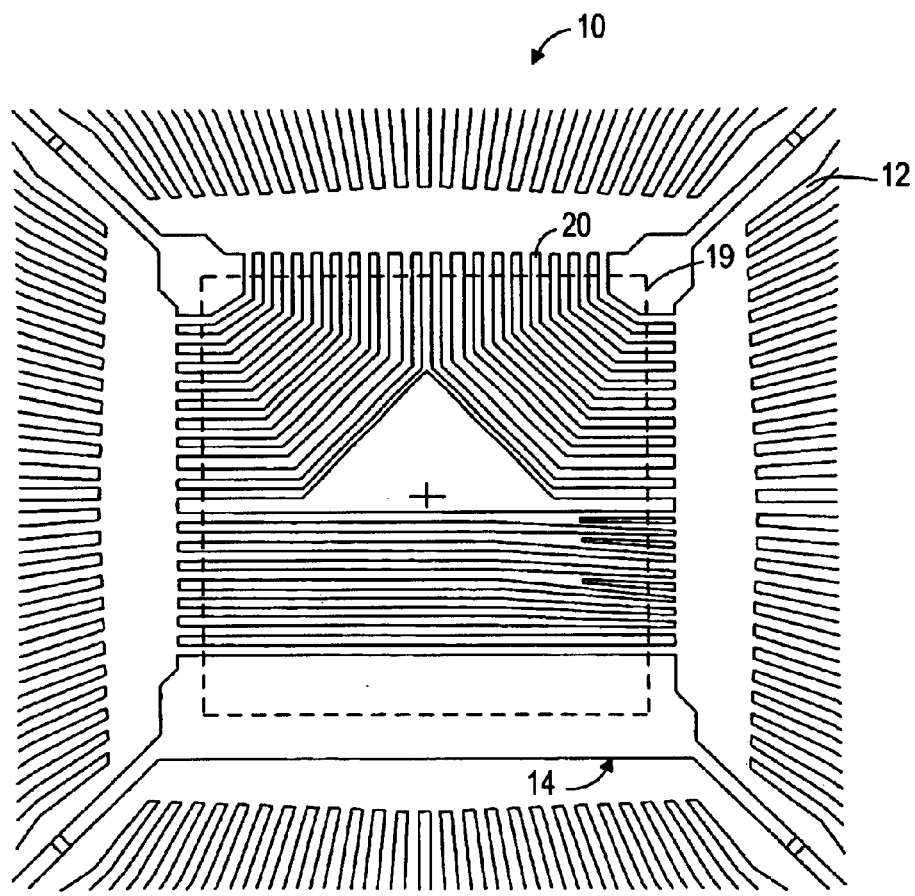
FIG. 2 shows a lead frame with internal leads formed from the lead frame of FIG. 1.

FIG. 2 shows lead frame 10 after removal of the outer portions of paddle area 14. Traces 17 are no longer electrically connected to other traces. Instead, each resulting inner lead trace 20 is electrically isolated from other ILTs 20. As shown in FIG. 2, ILTs 20 can carry signals to and from adjacent sides or to and from opposite sides of paddle area 14. It should be noted that the lead frame shown in FIG. 2 can be modified so that ILTs 20 can carry signals to and from the perimeter and the interior of paddle area 14 for die with center bond pads. To achieve this, an interior portion of paddle area 14 is removed, such that ILTs 20 have ends at the perimeter and interior of paddle area 14. This is in contrast to lead frame 10 of FIG. 2, in which ILTs 20 have ends only at the perimeter of the paddle area.

Figure 3A:
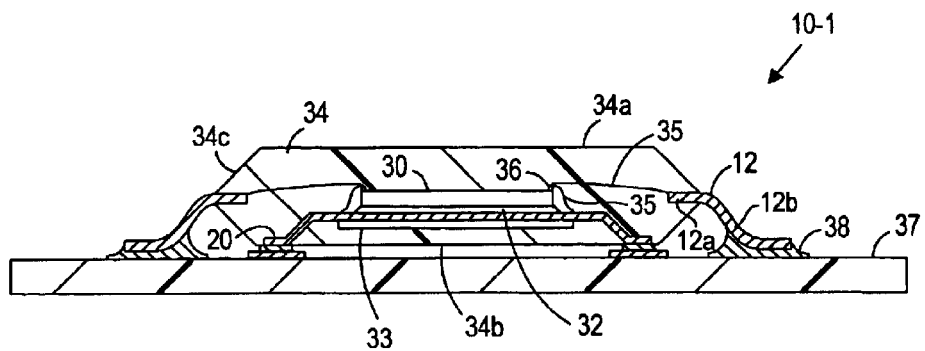
FIGS. 3A and 3B are side views of a die package according to two embodiments of the present invention.

A die can then be attached to lead frame 10 of FIG. 2. FIG. 3A is a side view of a lead frame package 10-1 with a die 30, according to one embodiment. Die 30 is secured to ILTs 20 using a non-conductive film or die attach paste 32, with an inner lead trace (ILT) tape 33, such as a standard lead locking tape discussed above, placed on the bottom of ILT 20. Note that die 30 may also be secured to ILT tape 33 by film or paste 32 when tape 33 is placed on the top side 20a of ILTs 20 (see FIG. 3B). The ILTs 20 are down set and an outer portion of the ILT is vertically bent, such that a bottom surface of an outer end portion of the respective ILT adjacent the outer end will be exposed after die 10 has been encapsulated or packaged, such as with a conventional encapsulant or mold compound 34. The position of the inward remainder of the respective ILTs 20 can be on approximately the same plane as the external lead bond fingers, the die attach pad, or somewhere in between. The ILTs 20 are down set during the manufacture of the lead frame, prior to the die assembly process. Bond pads 36 of die 30 and selected ones of ILTs 20 and OLTs 12 are wire-bonded, such as with thin conductive bond wires 35, to provide the desired signal routing or interconnections between the die and the ILTs and OLTs. The package can then be encased, such as with encapsulant or mold compound 34. The encapsulant 34 includes a top surface 34a, a bottom surface 34b, and side surfaces 34c vertically between the top and bottom surfaces 34a, 34b. The ILTs 20 have their inner and outer ends within a perimeter of encapsulant 34. OLTs 12 have an encapsulated inner portion 12a to which bond wires 35 are bonded, and an unencapsulated outer portion 12b that extends from a peripheral side of encapsulant 34. The outer portion 12b is vertically bent so that a bottom surface portion the respective OLT 12 is approximately coplanar with the bottom of encapsulant 34 and the exposed bottom surface portion of ILTs 20. Portions of OLTs 12 and ILTs 20 are then attached to a printed circuit board (PCB) 37, such as with solder 38, to provide electrical connection between PCB 37 and die 30, via OTLs 12 and ILTs 20. Consequently, an increased number of inputs and outputs are possible to and from die 30.

Figure 3B:
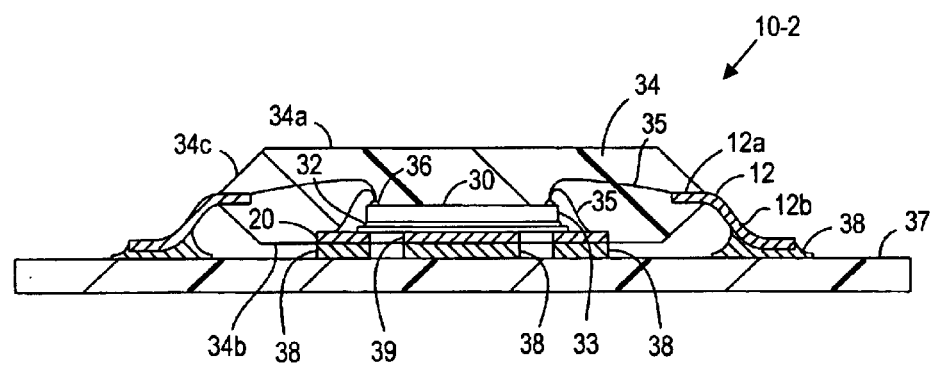

FIG. 3B is a side view of another embodiment of a lead frame package 10-2 with die 30. As noted above, die 30 is secured to ILT tape 33 by non-conductive film or paste 32 when tape 33 is placed on top of ILTs 20. In this embodiment, interior portions of ILTs 20 are also exposed through encapsulant 34, such as through an ILT pad 39. Die 30 can then be electrically connected to PCB 37 through OLTs 12, ILTs 20, and ILT pad 39 and solder 38. The additional connection using ILT pad 39 helps solve high frequency applications by creating low inductance signal paths through the bottom exposed ILT leads, with the exposed pad handling increased thermal needs due to the high frequency.

Figure 4:
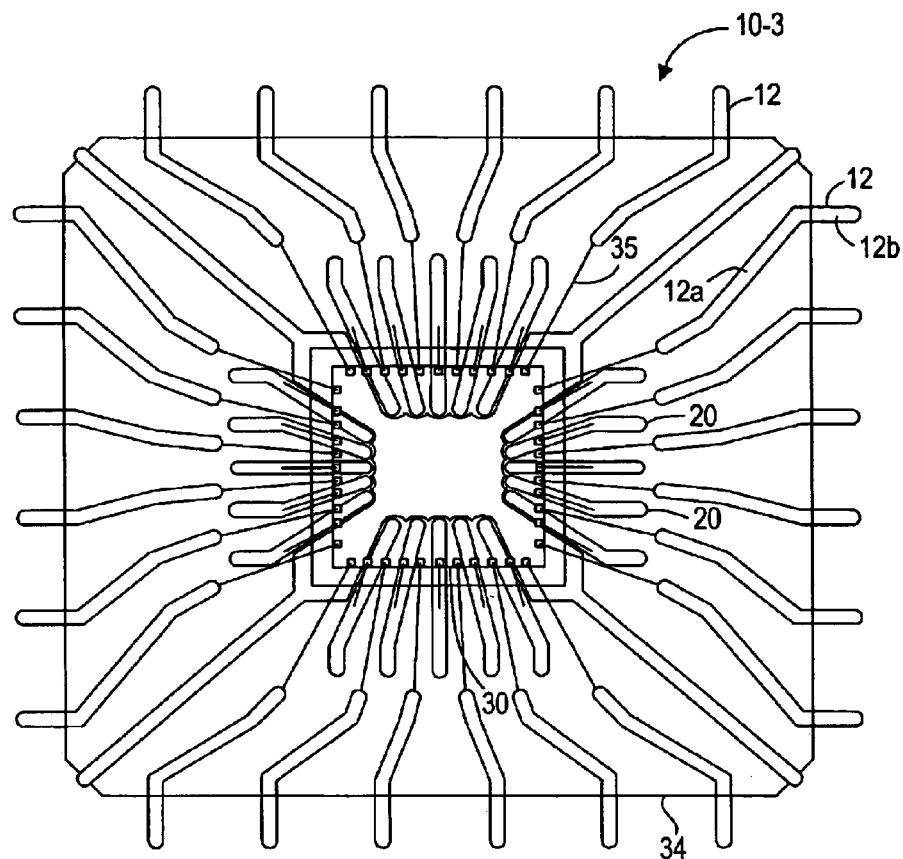
FIG. 4 is a top view of a die package, showing non-interleaved external and internal leads, according to one embodiment.

FIG. 4 is a top view showing one configuration and pattern of OLTs 12 and ILTs 20 electrically connected to die 30 in a lead frame package 10-3. Note that only the outline of die 30 is shown to illustrate the underlying ILTs 20.

Figure 5:
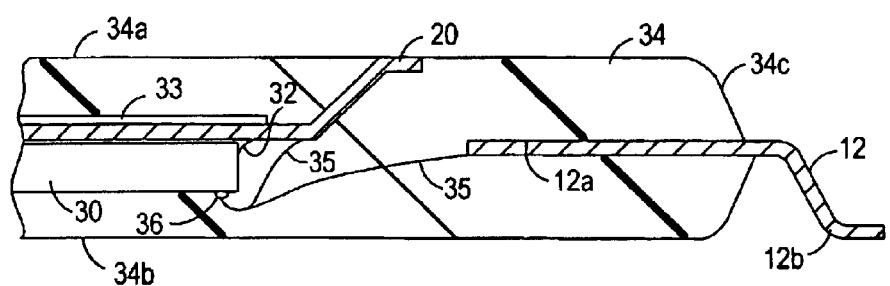
FIG. 5 is a side of view of a portion of a die package according to another embodiment of the invention.
Figure 6:
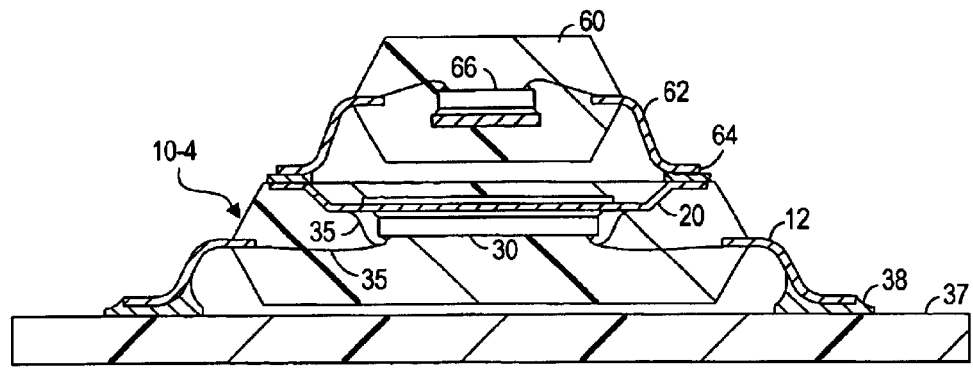
FIG. 6 is a side view of stacked die packages using the die package of FIG. 5.

In another embodiment, ILTs 20 can be down set or bent away from OLTs 12, as shown in lead frame package 10-4 of FIG. 5. In this embodiment, ILTs 20 are exposed on the upper surface of the die package. As shown in FIG. 6, this allows a second die package 60 to be stacked and electrically connected to die 30. External leads or fingers 62 from second die package 60 can be attached to ILTs 20 with a conductive material, such as solder 64. Connections from both die 30 and a die 66 of second die package 60 to PCB 37 are available through OLTs 12 and solder 38. As a result, multiple die and packages can be stacked and connected, and with thin package design, having a lower profile that conventional packages. Further, individual die in each package can first be tested before the die and package are stacked and connected to another die. If the die is bad or non-functioning, it is not connected to good die, thereby preventing bad die from consuming good die. Consequently, yield is increased over conventional single packages with stacked multiple die.

Figure 7A:
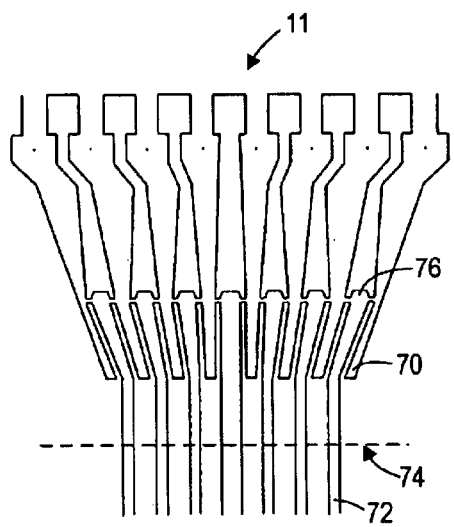
FIGS. 7A and 7B are top views of a partial lead frame, according to another embodiment of the present invention, in which the external and internal leads are interleaved.
Figure 7B:
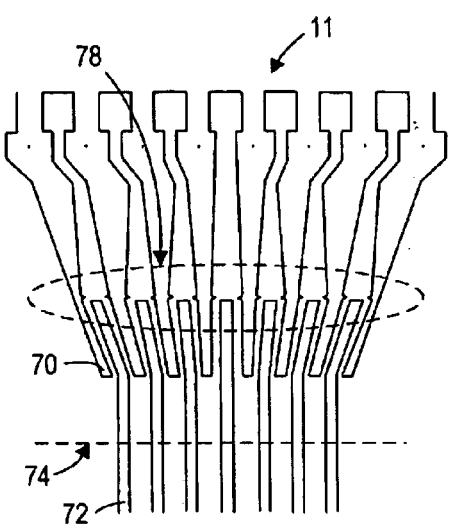
Figure 8:
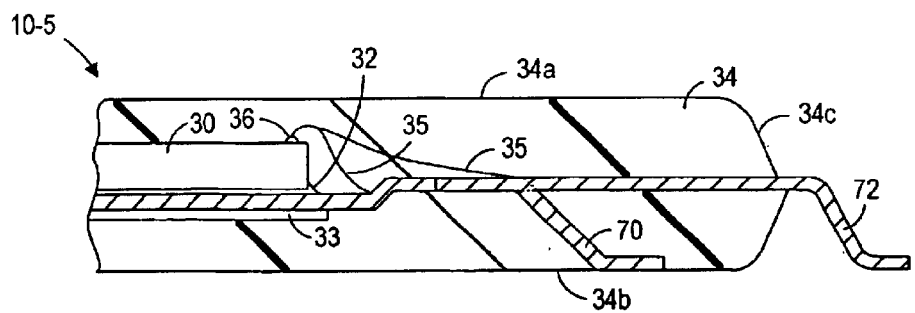
FIG. 8 is a side view of a portion of a die package utilizing the lead frame of FIG. 7B.

Other embodiments of the present invention utilize ILTs and OLTs that are interleaved. This is in contrast to the above embodiments, in which the ends of the ILTs and OLTs do not overlap, i.e., not interleaved. FIG. 7A shows a portion of a partially-complete lead frame 11 having external leads 70 and internal leads 72. Internal leads 72 are exposed above dotted line 74, underneath which indicates the ILT tape. As seen from FIG. 7A, external leads 70 and internal leads 72 are electrically connected at portions 76 prior to trimming according to allow conventional lead frame manufacturing process. FIG. 7B shows the portion of the lead frame 11 of FIG. 7A after trimming away portions 76, where the dotted line 78 indicates the trim area. As a result, interleaved external leads 70 and internal leads 72 are electrically isolated. The ends of internal leads 72 extend beyond the ends of external leads 70, which are now closer to the die. This allows the use of shorter bonding wires between external leads 70 and the die and enables exposed ILT pads to accommodate larger package outlines for stacking on top.

A die can then be attached to the lead frame 11 of FIG. 7B. The die can be attached, such as described above with respect to FIG. 3 or using any other suitable processes. FIG.

8 is a side view of a portion of die 30 attached to the lead frame 11 of a package 10-5. Die 30 is affixed to the lead frame with die attach paste 32. ILT tape 33 is placed on the bottom of the internal leads 70. The ends of internal leads 70 are down set or bent, such that the ends will be exposed after die 30 has been encapsulated or packaged. The position of the ends of internal leads 70 can be on approximately the same plane as the ends of external leads 72, the die attach pad, or somewhere in between. Wire bonding then provides electrical connection between die 30 and internal leads 70 and external leads 72, such as with bond wires 35 attached to bond pads 36. Note that the bond wires connected to external leads 72 in this embodiment are shorter than with the embodiment of FIG. 3. The package 10-5 can then be encased, such as with encapsulant or mold compound 34. Thus, similar to FIG. 3, this embodiment provides additional input/output connections to die 30.

Figure 9:
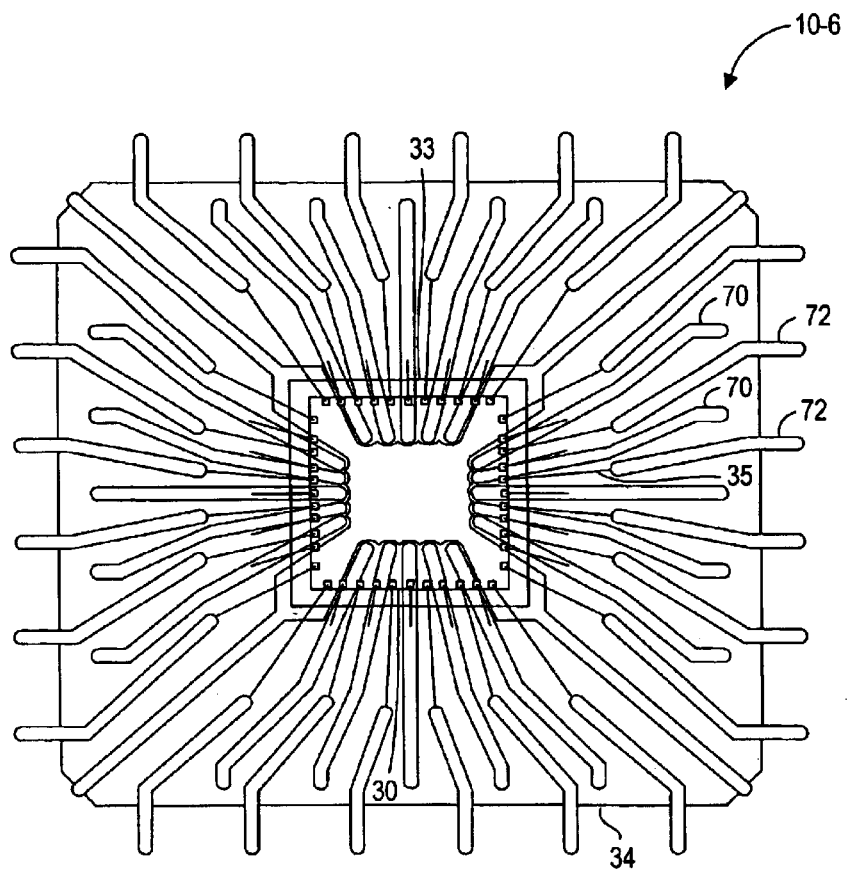
FIG. 9 is a top view of a die package, showing interleaved external and internal leads, according to another embodiment of the invention.

FIG. 9 is a top view showing one embodiment of a lead frame package 10-6 the invention, in which external leads 72 and internal leads 70 are interleaved. Note that bond wires 35 connected to external leads 72 are shorter here than the corresponding bond wires 35 of FIG. 4.

Figure 10:
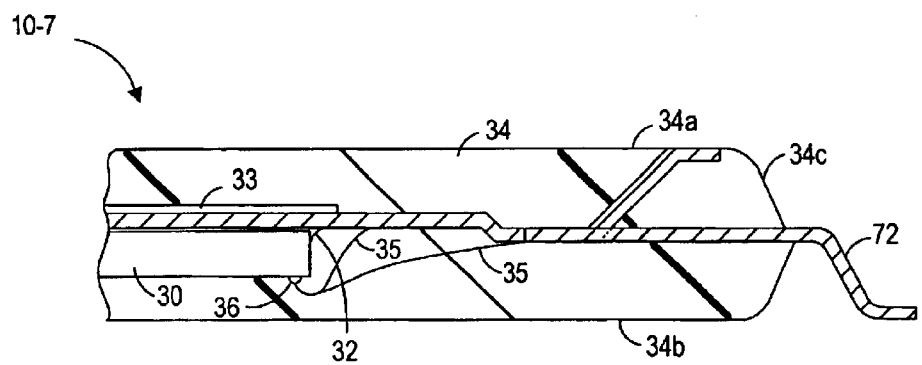
FIG. 10 is a side view of a portion of a die package in which the internal leads are exposed on an upper surface of the package.

In another embodiment, FIG. 10 is a side view of a portion of a lead frame package 10-7, in which internal leads 70 have been down set or bent away from external leads 72, similar to FIG. 5 above. Internal leads 70 are exposed on the upper surface of the die package, thereby allowing a second die package to be electrically connected thereto, similar to FIG. 6 above. Again, the difference with this embodiment is shorter bond wires between the die and the external leads and a larger package outline for stacking on top can be accommodated.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

What is claimed is:

1. A semiconductor die package, comprising:
    an encapsulant body having opposed top and bottom surfaces and side surfaces vertically between the top and bottom surfaces;
    inner leads each having an inner first and an outer second end, the first and second ends being within the encapsulant body;
    outer leads each having an inner portion within the encapsulant body and an outer portion extending outside of the encapsulant body;
    a die paddle within the encapsulant body,
    wherein the inner leads and the die paddle are lower in the encapsulant body than the encapsulated inner portions of the outer leads, a bottom surface portion of each of the inner leads and the die paddle is exposed at the bottom surface of the encapsulant body, and the unencapsulated outer portion of each of the outer leads includes a bottom surface portion that is approximately coplanar with the bottom surface of the encapsulant body and the exposed bottom surface portions of the die paddle and inner leads; and
    a semiconductor die within the encapsulant body, mounted on the inner leads and the die paddle, and electrically coupled to the inner leads and to the inner portion of the outer leads.

2. The package of claim 1, wherein an inner end of the encapsulated inner portion of the outer leads does not extend inwardly beyond the second end of the inner leads.

3. The package of claim 1, wherein an inner end of the encapsulated inner portion of the outer leads extends inwardly beyond the second end of the inner leads.

4. The package of claim 1, further comprising an encapsulated layer of an insulative tape coupled across the inner leads and disposed between the inner leads and the semiconductor die.

5. The package of claim 1, further comprising an encapsulated layer of an insulative tape coupled across the inner leads, wherein the inner leads are disposed between the layer of the insulative tape and the semiconductor die.

6. The package of claim 1, wherein the inner leads include an encapsulated second bottom surface portion that is adjacent to the exposed bottom surface portion of the inner lead.

7. The package of claim 1, wherein the inner leads are planar between the first and second ends.

8. A semiconductor die package, comprising:
    an encapsulant body having opposed top and bottom surfaces and side surfaces vertically between the top and bottom surfaces;
    inner leads each having an inner first end and an outer second end, the first and second ends being within the encapsulant body;
    outer leads each having an encapsulated inner portion within the encapsulant body and an unencapsulated outer portion that extends outward from the side surface of the encapsulant body;
    a die paddle within the encapsulant body,
    wherein a bottom surface portion of each of the inner leads and the die paddle is exposed at the bottom surface of the encapsulant body, and the unencapsulated outer portion of each of the outer leads is vertically bent so as to have a bottom surface portion that is approximately coplanar with the bottom surface of the encapsulant body and the exposed bottom surface portions of the inner leads; and
    a semiconductor die within the encapsulant body, mounted on the inner leads and the die paddle, and electrically coupled to the inner leads and to the inner portion of the outer leads.

9. The package of claim 8, wherein an inner end of the encapsulated inner portion of the outer leads does not extend inwardly beyond the second end of the inner leads.

10. The package of claim 8, wherein an inner end of the encapsulated inner portion of the outer leads extends inwardly beyond the second end of the inner leads.

11. The package of claim 8, further comprising an encapsulated layer of an insulative tape coupled across the inner leads and disposed between the inner leads and the semiconductor die.

12. The package of claim 8, further comprising an encapsulated layer of an insulative tape coupled across the inner leads, wherein the inner leads are disposed between the layer of the insulative tape and the semiconductor die.

13. The package of claim 8, wherein the inner leads include an encapsulated second bottom surface portion that is adjacent to the exposed bottom surface portion of the inner lead.

14. The package of claim 8, wherein the inner leads are planar between the first and second ends.

15. A semiconductor die package, comprising:
    an encapsulant body having opposed first and second surfaces and side surfaces vertically between the first and second surfaces;

inner leads each having an inner first end and an outer second end, the first and second ends being within the encapsulant body;

outer leads each having an encapsulated inner portion within the encapsulant body and an unencapsulated outer portion that extends outward from the side surface of the encapsulant body;

a die paddle within the encapsulant body, wherein a surface portion of each of the inner leads is exposed at the first surface of the encapsulant body, and the unencapsulated outer portion of each of the outer leads is vertically bent so as to have a surface portion that is approximately coplanar with one of the first and second surfaces of the encapsulant body;

a semiconductor die within the encapsulant body, mounted on the inner leads and the die paddle, and electrically coupled to the inner leads and to the inner end portion of the outer leads.

16. The package of claim 15, wherein an inner end of the encapsulated inner portion of the outer leads does not extend inwardly beyond the second end of the inner leads.

17. The package of claim 15, wherein an inner end of the encapsulated inner portion of the outer leads extends inwardly beyond the second end of the inner leads.

18. The package of claim 15, further comprising an encapsulated layer of an insulative tape coupled across the inner leads and disposed between the inner leads and the semiconductor die.

19. The package of claim 15, further comprising an encapsulated layer of an insulative tape coupled across the inner leads, wherein the inner leads are disposed between the layer of the insulative tape and the semiconductor die.

20. The package of claim 15, wherein the inner leads include an encapsulated second bottom surface portion that is adjacent to the exposed bottom surface portion of the inner lead.

21. The package of claim 15, wherein the inner leads are planar between the first and second ends.

22. The package of claim 15, wherein the unencapsulated outer portion of each of the outer leads is bent so as to have a surface portion that is approximately coplanar with the first surface of the encapsulant body.

23. The package of claim 15, wherein the unencapsulated outer portion of each of the leads is bent so as to have a surface portion that is approximately coplanar with the second surface of the encapsulant body.

* * * * *